United States Patent [19]

Le Can et al.

[11] 4,326,136
[45] Apr. 20, 1982

[54] THRESHOLD CIRCUIT USING COMPLEMENTARY FIELD EFFECT TRANSISTORS

[75] Inventors: Claude J. P. F. Le Can, Nijmegen; Maurice V. Whelan, Eindhoven; Karel Hart, Nijmegen, all of Netherlands

[73] Assignee: U.S. Philips Corporation, New York, N.Y.

[21] Appl. No.: 35,977

[22] Filed: May 4, 1979

[30] Foreign Application Priority Data

May 11, 1978 [NL] Netherlands ................. 7805068

[51] Int. Cl.³ ............... H03K 19/094; H03K 19/017
[52] U.S. Cl. ......................... 307/451; 307/361; 307/464; 357/42
[58] Field of Search ............ 307/205, 209, 213, 251, 307/304, 360, 361, 451, 464; 340/347 M; 357/42, 44

[56] References Cited

U.S. PATENT DOCUMENTS 3,823,330 7/1974 Rapp ......................... 307/205 X
4,032,795 6/1977 Hale .......................... 307/205 X Primary Examiner—Eugene R. LaRoche
Attorney, Agent, or Firm—Thomas A. Briody; Robert T. Mayer; Steven R. Biren

[57] ABSTRACT

A threshold arrangement includes two complementary transistors whose channels are situated in series between two supply terminals. In order to obtain a substantially square-wave relationship between the output voltage on the common drain electrodes and the input voltage on the interconnected gate electrodes, a direct voltage source is included between the two gate electrodes, which source has a voltage which is preferable substantially equal to the supply voltage minus the sum of the threshold voltages of the two complementary transistors.

16 Claims, 16 Drawing Figures

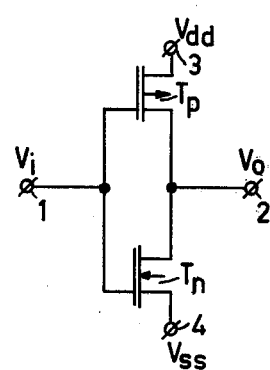
Fig.1a
PRIOR ART
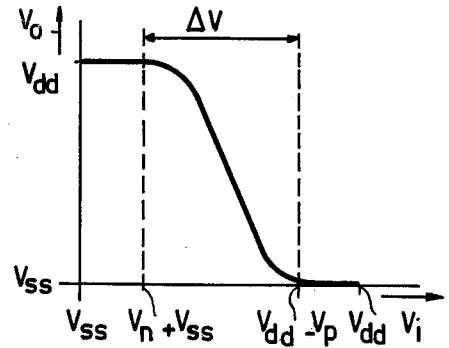
Fig.1b
PRIOR ART
Fig.1c
PRIOR ART
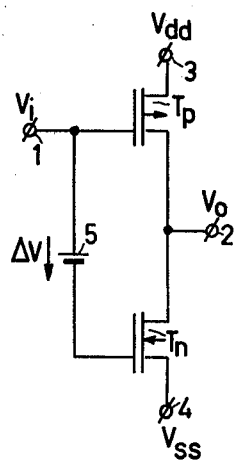
Fig.2a
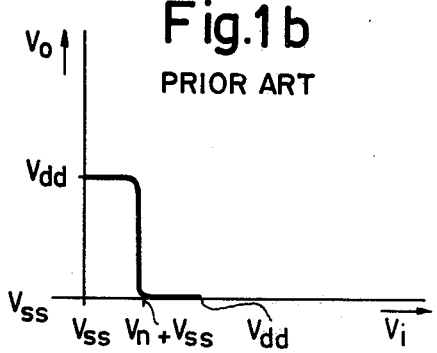
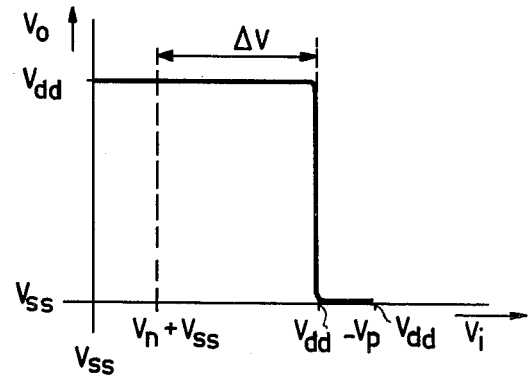
Fig.2b

THRESHOLD CIRCUIT USING COMPLEMENTARY FIELD EFFECT TRANSISTORS

BACKGROUND OF THE INVENTION

The invention relates to a threshold circuit comprising a first field-effect transistor of a first conductivity type with a gate electrode, a source electrode and a drain electrode, a second field-effect transistor of a second complementary conductivity type with a gate electrode, a source electrode and a drain electrode, an input terminal connected to the gate electrodes of the first and the second field-effect transistor, an output terminal connected to the drain electrodes of the first and the second field-effect transistor, a first and a second power supply terminal connected to the source electrode of the first and the second field-effect transistor respectively, and first means for the application of a supply voltage between the first and the second power supply terminal.

Such circuits are, for example, known as inverters in logic circuitry. In such circuits the magnitude of the supply voltage also determines the dynamic range of the output voltage. Therefore it is desirable that the supply voltage is high relative to the threshold voltage of the transistors which are used, for example 10 V supply voltage relative to a threshold voltage of for example 1 V. However, it is then found that the input voltage swing, which is necessary to cause the output voltage to change from the one extreme value to the other extreme value, is also comparatively large relative to said threshold voltage, which renders these circuits less suitable for use as a threshold circuit, because then the threshold level is not accurately defined and the switching speed is limited.

SUMMARY OF THE INVENTION

The first object of the invention is to provide a threshold circuit of the said type, which requires a smaller input signal swing to cause the output signal to change from the one extreme value to the other extreme value.

In addition, it is the second object of the invention to provide a threshold circuit of the said type having different thresholds, which is suitable for use as an analog-to-digital converter.

For versatility, it is frequently desirable that the circuits are integrated only partly, so that it is the third object of the invention to provide an integrated circuit for a threshold circuit with different thresholds, which integrated circuit can be of very compact construction.

In order to meet the first-mentioned object, the invention is characterized by second means for the application of a direct voltage between the gate electrodes of the first and the second field-effect transistor, which voltage has the same polarity as the supply voltage to be applied.

The voltage swing required at the input to cause the output voltage to change from the one extreme value to the other extreme value is minimal if said direct voltage between the gate electrodes of the first and the second field-effect transistor is of the same order of magnitude as the supply voltage to be applied minus the sum of the threshold voltages of the first and the second field-effect transistors.

For many applications, for example in an analog-to-digital converter, it is desirable that the threshold value of the threshold circuit can be selected freely relative to the supply voltage.

A first embodiment of a threshold circuit is therefore characterized by third means for the application of a direct voltage between the input terminal and the gate electrode of the first field-effect transistor. The direct voltage between the input terminal and the gate electrode of the first transistor then shifts the change-over point by a value equal to said direct voltage.

An embodiment of such a threshold circuit with a direct voltage between the input terminal and the gate electrode of the first transistor and direct voltage between the gate electrodes of the first and the second transistor is characterized in that said third means comprise a first resistor, which is included between the input terminal and the gate electrode of the first field-effect transistor, the second means being constituted by a second resistor which is included between the gate electrode of the first and the second field-effect transistor and means for passing a direct current through the series connection of the first and the second resistors.

When the direct voltage between the input terminal and the gate electrode of the first transistor and the direct voltage between the gate electrodes of the first and the second transistors have the same polarity relative to the gate electrode of the first transistor it is advantageous that said third means are common with at least a part of said second means.

An embodiment of such a threshold circuit is characterized in that said second and third means comprise a first resistor between the input terminal and the gate electrode of the first field-effect transistor, a second resistor between the input terminal and the gate electrode of the second transistor, and means for passing a direct current through the series connection of the first and the second resistors.

In the embodiment in which a direct current is passed through the first and the second resistors it is advantageous that said means for passing a direct current are constituted by means for the application of a direct voltage across the series connection of the first and the second resistors.

An analog-to-digital converter can be realized with the aid of threshold circuits when a plurality of these circuits with mutually different thresholds are combined with a common signal input. The embodiments of the threshold circuit in accordance with the invention in which the direct voltage between the gate electrodes of the first and the second transistor is realized with the aid of the second resistor and the threshold-value is shifted with the aid of the first resistor, are found to be particularly suitable for use in an analog-to-digital converter. In order to achieve the second object of the invention such a threshold circuit is characterized in that the threshold circuit comprises a first series connection of n resistors between a first and a second point, a second series connection of n resistors between the second point and a third point, that each time the $i^{th}$ resistor of the first series connection, reckoned from the first point, is included between the gate electrodes of an $i^{th}$ and an $(i+1)^{th}$ field-effect transistor of the first conductivity type, and each time the $i^{th}$ resistor of the second series connection, reckoned from the second point, is included between the gate electrodes of an $i^{th}$ and an $(i+1)^{th}$ field-effect transistor of the second conductivity type, i being a positive integer varying from 1 to n, that each time the drain electrode of the $i^{th}$ field-effect transistor of the first conductivity type together with the drain electrode of the $i^{th}$ field-effect transistor of the second conductivity type is connected to an $i^{th}$ output terminal, that the source electrodes of the n+1 field-effect transistors of the first conductivity type are jointly connected to the first power supply terminal, that the source electrodes of the n+1 field-effect transistors of the second conductivity type are jointly connected to the second power supply terminal, and that there are provided means for causing direct currents to flow through the first and the second series connections.

In this embodiment each pair of $i^{th}$ transistors constitutes a threshold circuit in accordance with the invention. The number of resistors included between the gate electrodes of every two $i^{th}$ transistors is always the same. When these resistors all have the same value the resistance value between the two gate electrodes is the same for each pair and thus the direct voltages between them are the same.

If the second point between the two series connections is taken as the input, the number of resistors between said input and the gate electrode of the transistor of the first conductivity type of each $i^{th}$ pair differs every time and thus the threshold value differs. If said resistors are identical the threshold value of every subsequent threshold circuit in the series from i=1 to i=n+1 is always a voltage which is IXR higher, I being the direct current through said resistors and R the value of each of said resistors. If the quiescent voltage on said input is lower than the lowest threshold value, the number of threshold circuits whose threshold is exceeded upon application of an input voltage will be a measure of said input voltage.

A similar reasoning is valid if any other point of the two series connections of n resistors, for example the said first point, is chosen as signal input.

This last-mentioned embodiment may further be characterized in that said means for causing direct currents to flow are constituted by a direct voltage source between the first and the third point.

In this respect it is advantageous that an input resistor is included between the first point and a point of constant voltage for receiving a signal input current. This signal input current produces a signal voltage across the input resistor which voltage, because a direct voltage appears across each resistor of the first and second series connection, is available on every point of said series connections.

A further advantageous step is characterized in that the threshold circuit comprises a bias current source for causing a bias current to flow through the input resistor.

The bias current source enables the quiescent setting of the signal input to be controlled.

The integrated circuit in accordance with the invention which meets the third object is characterized by a first and a second resistance track, which tracks extend in substantially parallel directions, a series of n first field-effect transistors of a first conductivity type which are situated on a row which is substantially parallel to the first resistance track, a series of n second field-effect transistors of a second complementary conductivity type, which are situated on a row which is substantially parallel to the second resistance track, a first field effect transistor being each time situated opposite a second field-effect transistor, a first conductor track which is substantially parallel to the row of first field-effect transistors and a second conductor track which is situated substantially parallel to the row of second field-effect transistors, the gate electrodes of the first field effect transistors each being connected to the first resistance track, the gate electrodes of the second field-effect transistors each being connected to the second resistance track, the source electrodes of the first field-effect transistors each being connected to the first conductor track, the source electrodes of the second field-effect transistors each bein connected to the second conductor track, and that each drain electrode of a first field-effect transistor is connected to the drain electrode of the second field-effect transistor situated opposite said first field-effect transistor.

This structure can very simply be extended to a threshold circuit which meets the second objective by means of for example external connections and components. This integrated circuit is then very compact with minimal connections between the pairs of transistors of the first and the second conductivity type and the number of crossing connections can be minimized.

In this integrated circuit it is advantageous that the first field-effect transistors are situated with their channels parallel to the first resistance track between the first resistance track and the first conductor track, branches of said first resistance track and said first conductor track respectively leading to the gate electrodes and the source electrodes of the first field-effect transistors, and that the second field-effect transistors are situated with their channels parallel to the second resistance track between the second resistance track and the second conductor track, branches of said second resistance track and said conductor track respectively leading to the gate electrode and the source electrodes of the second field-effect transistors.

Owing to this step the two resistance tracks and the two second conductor tracks can be connected to the source and the gate electrodes of the two rows of transistors without connections which cross each other.

It is furthermore advantageous that the two resistance tracks are situated between the two rows of field-effect transistors and that the two conductor tracks are situated one on each side of the two transistor rows.

With respect to the connections between the drain electrodes of the transistors which are disposed opposite each other the integrated circuit may further be characterized in that the two resistance tracks are covered with an insulating layer and that the drain electrodes of every two facing field-effect transistors are connected to third conductor tracks, which pass over said insulating layer.

In order to enable connections to be made to said third conductor tracks the integrated circuit may further be characterized in that said third conductor tracks adjoin third tracks of the same material as the first and the second resistance track, which third tracks are also covered with an insulating layer and pass underneath said first conductor track in directions substantially perpendicular to the direction of the first conductor track.

A further step which is suitable for integration in order to meet the desired object is characterized in that is provided a fourth conductor track for connecting one end of the first resistance track to that end of the second resistance track other than the end which is situated opposite said end of the first resistance track.

BRIEF DESCRIPTION OF THE DRAWING

The invention will now be described in more detail with reference to the drawing. In the drawing:

FIG. 1a shows a known C-MOS inverter circuit,

FIG. 1b shows a diagram associated with the circuit of FIG. 1a.

FIG. 1c also shows a diagram associated with the circuit of FIG. 1a.

FIG. 2a shows a first embodiment of a circuit arrangement in accordance with the invention, FIG. 2b shows a diagram associated with the arrangement of FIG. 2a, FIG. 3a shows a second embodiment of an arrangement in accordance with the invention.

DETAILED DESCRIPTION

Figures 3A, 3B, 3C:
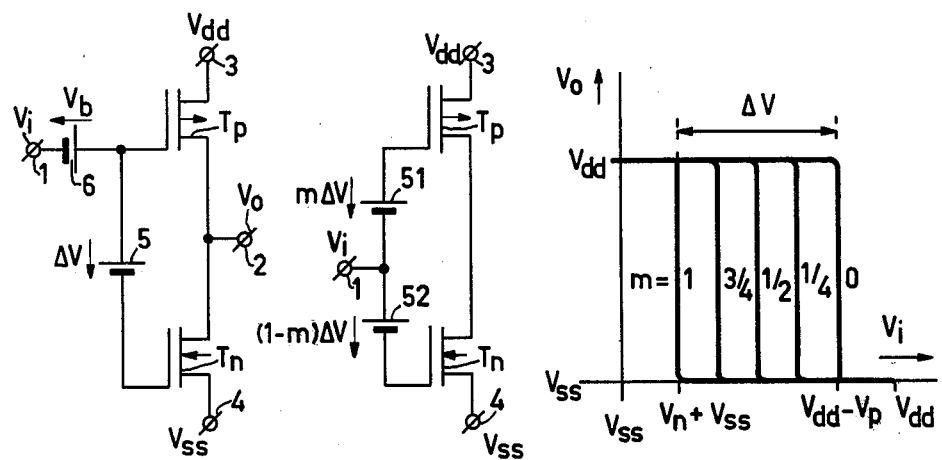
FIG. 3b shows an improved embodiment of the arrangement of FIG. 3a, FIG. 3c shows a diagram associated with the arrangement of FIG. 3b.

FIG. 1a shows a known C-MOS inverter circuit with a p-channel field-effect transistor $T_p$ and an n-channel field-effect transistor $T_n$. The gate electrodes of the two field-effect transistors $T_p$ and $T_n$ are connected to an input terminal 1 and the drain electrodes to an output terminal 2. Furthermore, the drain electrode of transistor $T_p$ is connected to a power-supply terminal 3 and the source electrode of transistor $T_n$ to a power-supply terminal 4.

If the voltage on the terminals 1, 2, 3 and 4 are $V_i$, $V_o$, $V_{dd}$ and $V_{ss}$ respectively, FIG. 1b shows a diagram giving the relationship between the output voltage $V_o$ and the input voltage $V_i$. If the input voltage $V_i$ is equal to $V_{ss}$, transistor $T_n$ is non-conducting and transistor $T_p$ is conducting and the output voltage $V_o$ (in unloaded condition) is equal to $V_{dd}$. If the input voltage $V_i$ increases and exceeds the threshold voltage $V_n$ of transistor $T_n$ ($V_i = V_{ss} + V_n$), transistor $T_n$ is turned on, while transistor $T_p$ becomes less conductive, so that $V_o$ decreases. When the input voltage $V_i$ exceeds the threshold voltage $V_p$ of transistor $T_p$ ($V_i = V_{dd} - V_p$), transistor $T_p$ is turned off and the output voltage $V_o$ is equal to $V_{ss}$.

In the change-over range $\Delta V$ the output voltage is not accurately defined and depends on various parameters. As a result of this no accurate change-over point can be defined.

FIG. 1c shows the same characteristic as FIG. 1b for $V_{dd} - V_{ss} = V_n + V_p$. Since in the characteristics of FIG. 1b $\Delta V = V_{dd} - V_{ss} - V_n - V_p$, this means that $\Delta V = 0$ in the characteristics of FIG. 1c. The changeover point is accurately defined for $V_i = V_n + V_{ss}$. However, a drawback of this is that the voltage swing $V_{dd} - V_{ss}$ of the output signal $V_o$ is considerably reduced relative to the swing in the case of FIG. 1b, for example 2 V relative to 10 V.

FIG. 2a shows a threshold circuit in accordance with the invention. This circuit corresponds to the circuit of FIG. 1a with the addition of a voltage source 5, which in the present example has a voltage $\Delta V = V_{dd} - V_{ss} - V_n - V_p$, between the gate electrodes of the transistors $T_p$ and $T_n$.

FIG. 2b shows the associated diagram which corresponds to the diagram of FIG. 1b, but in this case the output voltage $V_o$ remains equal to $V_{dd}$ as long as the input voltage $V_i$ has not exceeded the value $V_{ss} + T_n + \Delta V$. This is because transistor $V_n$ is not turned on until $V_i = V_{ss} + V_n + \Delta V$. As for the source 5 a voltage $\Delta V = V_{dd} - V_{ss} - V_n - V_p$ has been chosen, so that $V_i = V_{dd} - V_p$, which is the value $V_i$ at which transistor $T_p$ is turned off. Consequently, the output voltage $V_o$ exhibits a sharp transition from $V_{dd}$ to $V_{ss}$ for $V_i = V_{ss} + \Delta V + V_n = V_{dd} - VV_p$ which is not incompatible with a large output voltage swing.

The voltage of the source 5 need not necessarily have the value $\Delta V$. Indeed, any value between 0 and $\Delta V$ yields an improvement. If the source 5 has a voltage $V_c$, the width of the transition is $\Delta V - V_c$ in comparison with a width of $\Delta V$ in the situation of FIG. 1b.

FIG. 3a shows a possibility to select the input voltage $V_i$ at which the threshold of the threshold circuit is exceeded independently of $V_{ss} + V_n + \Delta V$. For this purpose the circuit of FIG. 2a has been extended with a voltage source 6 between the gate electrodes of transistor $T_p$ and the input terminal 1. If this voltage source has a voltage $V_b$, the change-over point is situated at $V_i = V_{ss} + V_n + \Delta V - V_b$.

If the polarity of the voltage $V_b$ relative to the gate electrode of the transistor $T_p$ is the same as that of the voltage $\Delta V$, the sources 5 and 6 may be combined. Such an arrangement is shown in FIG. 3b. In this arrangement a voltage source 51 is included between the input terminal 1 and the gate electrode of transistor $T_p$ and a voltage source 52 between the input terminal 1 and the gate electrode of transistor $T_n$. Voltage source 51 then corresponds to the source 6 in FIG. 3a and the series connection of the source 51 and source 52 to the source 5 in FIG. 3a.

If the source 51 has a voltage $m\Delta V$ and the source 52 a voltage $(1-m)\Delta V$, the total voltage between the gate electrodes of transistors $T_p$ and $T_n$ equals $\Delta V$ and is independent of the parameter m. The change-over point is then situated at $V_i = V_{ss} + V_n + (1-m)\Delta V$ and can be adjusted by a suitable choice of the parameter m. FIG. 3c shows the associated characteristics for $m = 1, \frac{3}{4}, \frac{1}{2}, \frac{1}{4}$ and 0.

Figures 4, 5:
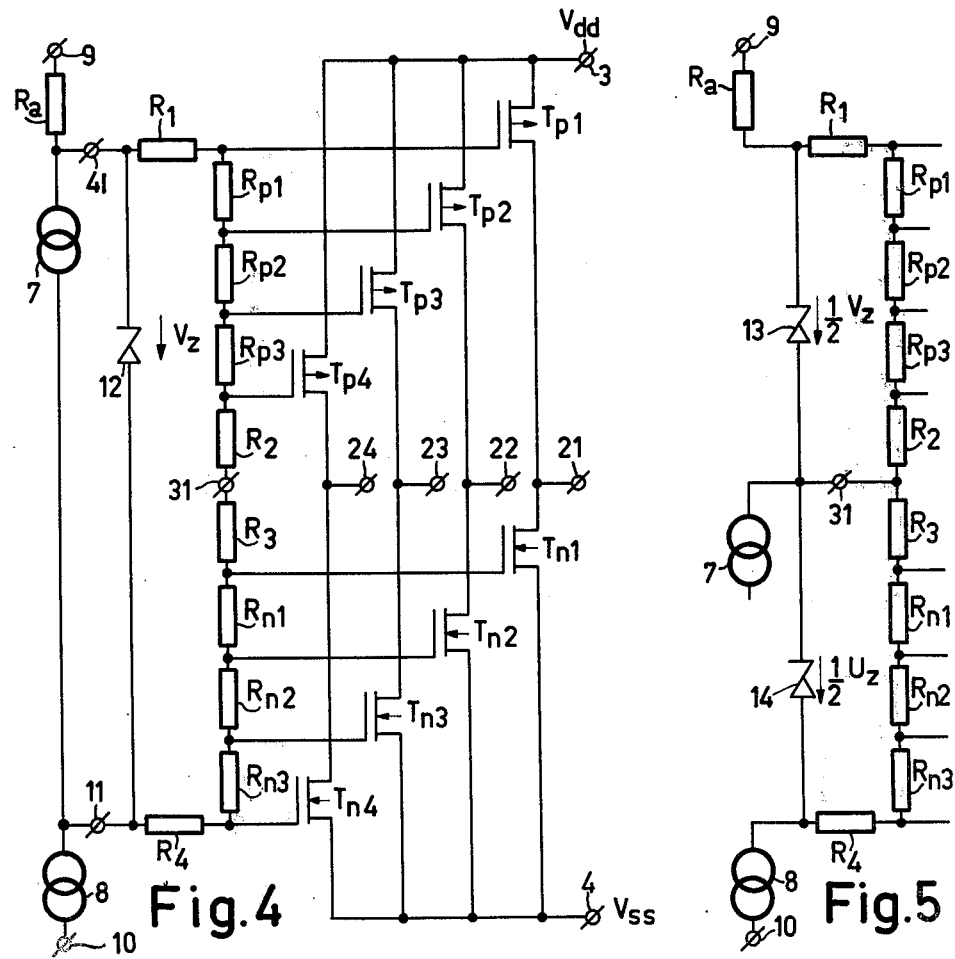
FIG. 4 shows a preferred embodiment of the circuit arrangement in accordance with the invention having a plurality of thresholds.
FIG. 5 shows a variant of a part of the arrangement of FIG. 4.

The circuit arrangements of FIGS. 3a and 3b are high suitable in be combined to an arrangement with a plurality of thresholds, for example in order to obtain an analog-to-digital converter. FIG. 4 shows such an arrangement with 4 thresholds. The arrangement comprises a first series connection of resistors $R_1$, $R_{p1}$, $R_{p2}$, $R_{p3}$ and $R_2$ between points 41 and 31 and the series connection of resistors $R_3$, $R_{n1}$, $R_{n2}$, $R_{n3}$ and $R_4$ between points 31 and 11. Furthermore, the arrangement comprises the p-channel transistors, $T_{p1}$, $T_{p2}$, $T_{p3}$ and $T_{p4}$ and the n-channel transistors $T_{n1}$, $T_{n2}$, $T_{n3}$ and $T_4$.

The respective gate electrodes of transistor $T_{p1}$, $T_{p2}$, $T_{p3}$, $T_{p4}$, $T_{n1}$, $T_{n2}$, $T_{n3}$ and $T_{n4}$ are connected to the junction point between the resistors $R_1$ and $R_{p1}$, $R_{p1}$ and $R_{p2}$, $R_{p2}$ and $R_{p3}$, $R_{p3}$ and $R_2$, $R_3$ and $R_{n1}$, $R_{n1}$ and $R_{n2}$, $R_{n2}$ and $R_{n3}$ and $R_{n3}$ and $R_4$ respectively. The drain electrodes of each pair of transistors $T_{p1}$ and $T_{n1}$, $T_{p2}$ and $T_{n2}$, $T_{p3}$ and $T_{n3}$, and $T_{p4}$ and $T_{n4}$ are jointly connected to an output terminal 21, 22, 23 and 24 respectively. The source electrodes of the transistors $T_{p1}$, $T_{p2}$, $T_{p3}$ and $T_{p4}$ are connected to the power-supply terminal 3 and the source electrodes of the transistors $T_{n1}$, $T_{n2}$, $T_{n3}$ and $T_{n4}$ to the power supply terminal 4. In order to obtain a direct current through the resistors between points 41 and 11 a zener diode 12 with a zener voltage of $V_z$ has been included between these points. Point 41 is connected to a point 9 of constant potential via a resistor $R_a$. A signal current source 7 passes a signal current through said resistor $R_a$. Furthermore point 11 is connected to a point 10 of constant potential via a bias current source 8.

As a result of the zener diode 12 a constant voltage appears across each resistor in the circuit between points 41 and 11. If the values of the resistors $R_{p1}$, $R_{p2}$, $R_{p3}$, $R_{n1}$, $R_{n2}$ and $R_{n3}$ are equal to each other the same direct voltage will appear across the gate electrodes of each pair of transistors $T_{p1}$ and $T_{n1}$, $T_{p2}$ and $T_{n2}$, $T_{p3}$ and $T_{n3}$, $T_{p4}$ and $T_{n4}$. If said resistors $R_{p1}$, $R_{p2}$, $R_{p3}$, $R_{p4}$, $R_{n1}$, $R_{n2}$, $R_{n3}$ and $R_{n4}$ have a value $R_o$ and the resistors $R_1$, $R_2$, $R_3$ have a value $\frac{1}{2}R_o$, this direct voltage between the gate electrodes of each pair equals $\frac{1}{8}V_z$. For the optimum situation it is therefor necessary that $V_z = 2\Delta V$. If the arrangement is extended to n pairs of transistors with the addition of resistors $R_{p4}$ to $R_{pn}$ and $R_{n4}$ to $R_{nn}$, the relation $V_z = 2\Delta V$ remains valid in this case. Thus, a large number of pairs may be combined, each with the same direct voltage between the gate electrodes.

If point 31 is regarded as the signal input, the gate electrodes of the transistors $T_{n1}$, $T_{n2}$, $T_{n3}$ and $T_{n4}$ have voltages which are shifted by $1/16 V_z$, $3/16 V_z$, $5/16 V_z$ and $7/16 V_z$, respectively relative to the direct voltage on input terminal 31. The arrangement of FIG. 4 thus comprises four combined circuits in accordance with FIG. 3b with the values $\frac{1}{8}$, $\frac{3}{8}$, $\frac{5}{8}$ and $\frac{7}{8}$ for the parameters m.

If point 11 or point 41 is taken as the signal input, the arrangement may be regarded as a combination of four circuits in accordance FIG. 3a.

The signal current source 7 passes a signal through resistor R, across which a signal voltage $V_i$ is produced. This signal voltage also appears on each point of the resistor chain between points 41 and 11, but with shifted d.c. level.

If by means of the bias current source 8, which also supplies the quiescent current for the zener diode 12, the quiescent voltage across resistor Ra is adjusted in such a way that in the absence of a signal current all transistors $T_{n1}$ to $T_{n4}$ are conducting and all transistors $T_{p1}$ to $T_{p4}$ are non-conducting, a voltage $V_{ss}$ will appear on all outputs 21 to 24. If signal current is supplied, transistors $T_{p1}$, $T_{p2}$, $T_{p3}$ and $T_{p4}$ will be turned on and the associated transistors $T_{n1}$ to $T_{n4}$ will be turned off consecutively at increasing signal current, so that the voltage $V_{dd}$ will consecutively apppear on outputs 21, 22, 23 and 24. A voltage $V_{dd}$ on an output may be regarded as a logic "1" level and a voltage $V_{ss}$ as a logic "0" level. If the conditions of the outputs are converted into a digital code, an analog-digital converter is obtained, the zero point being adjustable with the current source 8 and the step size with the resistor $R_a$, i.e. the signal current change necessary to change the condition of one subsequent output.

The arrangement of FIG. 4 may be extended to a very large number, for example 64, of transistor pairs $T_n$ and $T_p$.

With respect to the drive and adjustment of $\Delta V$ there are many possibilities. In the arrangement of FIG. 4 the zener diode 12 may be replaced by a different type of voltage source or may be dispensed with if a current source is added which passes a stabilized current through the resistor chain between points 41 and 11. If the zener diode is not included or if a separate quiescent current circuit for the zener diode is included, the bias current source 8 may also be connected directly to resistor $R_a$. As the zener diode constitutes a short-circuit for a signal current, said diode may also be connected to point 11. Furthermore, the signal may also be applied directly as a voltage to a suitable point of the resistor chain between points 41 and 11.

FIG. 5 illustrates a different method of driving the arrangement of FIG. 4. Transistors $T_{n1}$ to $T_{n4}$ and $T_{p1}$ to $T_{p4}$ are not shown for the sake of simplicity.

In comparison with the arrangement of FIG. 4, the zener diode 12 has been replaced by two zener diodes 13 and 14 in series each having a zener voltage equal to $\frac{1}{2}V_z$. The point between the two zener diodes is connected to point 31 and the signal current source 7 is also connected to point 31.

An arrangement as shown in FIG. 4 will generally take the form of an integrated circuit. The zener diode 12, the variable resistor $R_a$, the signal current source 7 and the bias current source 8 of the arrangement of FIG. 4 will not be incorporated in such an integrated circuit for greater versatility in use. However, the resistor chains between points 41 and 11 and all transistors $T_p$ and $T_n$ will be incorporated in said integrated circuit.

Figure 6:
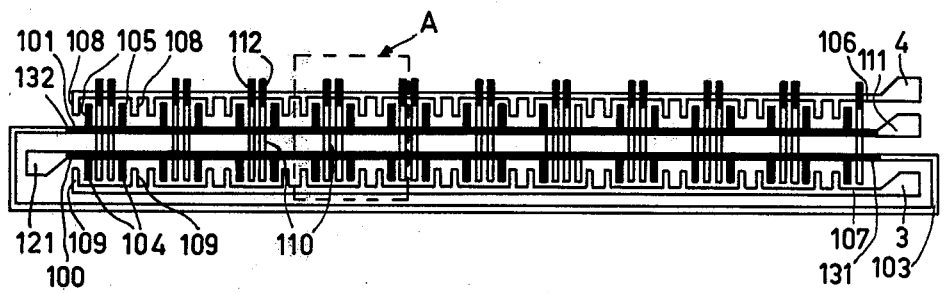
FIG. 6 shows the basic layout of an integrated circuit which incorporates the resistors and transistors of the arrangement of FIG. 4 in a very compact manner.

It has been found that the resistor network and the field-effect transistors in the arrangements of FIG. 4 can be integrated in highly compact form. FIG. 6 schematically shows the lay-out on the surface of such an integrated circuit.

The integrated circuit of FIG. 6 comprises a track 100 of a resistance material, n-type doped polysilicon in a practical embodiment, between points 121 and 131, which track constitutes the resistor chain between points 41 and 31 in accordance with FIG. 4. Similarly, a resistance track 101 between points 132 and 111 constitutes the resistor chain between points 31 and 11 in FIG. 4. Points 131 and 132 (which corresponds to point 31 in FIG. 4) may be interconnected to a metal track 103 as is shown in FIG. 6. If it is desirable to connect points 131 and 132 to terminals of the integrated circuit, this may also be effected outside the integrated circuit.

Figure 7:
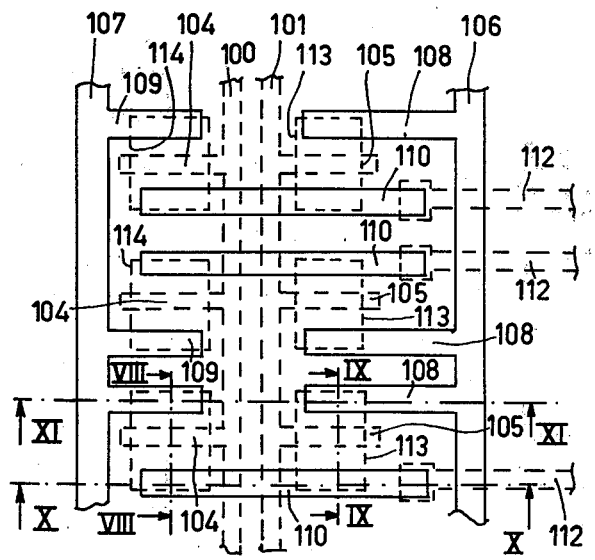
FIG. 7 shows a part of FIG. 6 in more detail.

Beside the track 100 all transistors $T_p$ are formed and beside the track 101 all transistors $T_n$ (these transistors are shown in FIG. 7). Branches 104 and 105 of the resistance tracks 100 and 101 respectively constitute the connections of the gate electrodes of all transistors $T_p$ and $T_n$ respectively. Parallel to track 101 a metal track 106 extends of which branches are connected to the source electrodes of all transistors $T_n$. Said metal track 106 leads to a terminal 4 (in accordance with FIG. 4) for the application of the supply voltage $V_{ss}$. Similarly, a metal track 107, of which branches 109 are connected to all source electrodes of all transistors $T_p$, extends parallel to track 100. Said track 107 leads to a terminal 3 for the application of the supply voltage $V_{dd}$. Metal tracks 110 interconnect the drain electrodes of the facing transistors $T_p$ and $T_n$ and each time lead to further circuits or to outputs 21, 22, 23, . . . as in the arrangement of FIG. 4 via a polysilicon track 112 (in order to facilitate crossing with the metal track 106).

The part A of the integrated circuit of FIG. 6 surrounded by a dashed line is shown in more detail in FIG. 7. In this figure the rectangles 113 drawn with a dashed line represent the transistors $T_n$, whose source electrodes, gate electrodes and drain electrodes are connected to the branches 108, 105 and the tracks 110 respectively. Similarly, the rectangles 114 drawn with a dashed line represent the transistors $T_p$, whose source electrodes, gate electrodes and drain electrodes are respectively connected to the branches 109, 104 and the tracks 110.

Figure 8:
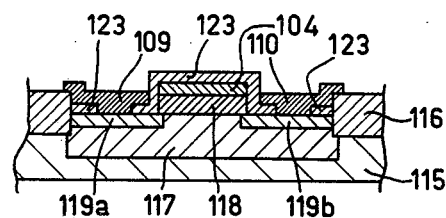
FIG. 8 shows a cross-sectional view of a p-channel transistor of the circuit of FIG. 7 taken on the line VIII-VIII.
Figure 9:
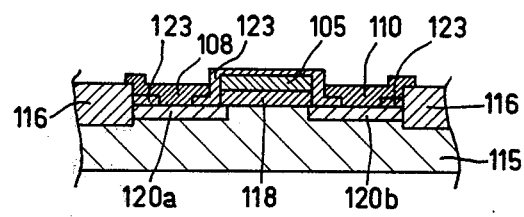
FIG. 9 is a cross-sectional view of an n-channel transistor of the circuit of FIG. 7 taken on the line IX—IX.
Figure 10:
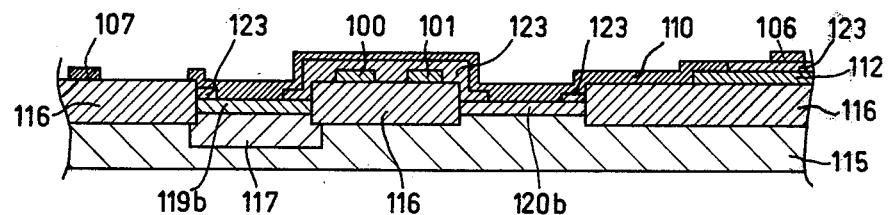
FIG. 10 shows a cross-sectional view of the circuit of FIG. 7 taken on the line X—X.
Figure 11:
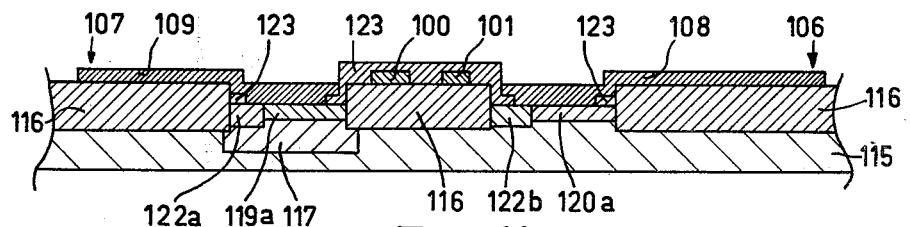
FIG. 11 shows a cross-sectional view of the circuit of FIG. 7 taken on the line XI—XI.

In order to illustrate the structure of the integrated circuit of FIG. 6, FIGS. 8, 9, 10 and 11 show four cross-sectional views indicated in FIG. 7, FIG. 8 being a cross-section of a p-channel transistor $T_p$, FIG. 9 a cross-section of an n-channel transistor $T_n$, FIG. 10 a cross-section through the drain electrodes of two adjacent transistors $T_p$ and $T_n$, and FIG. 11 a cross-section through the source electrodes of these two transistors.

In the present example the circuit is formed on an n-type substrate 115 with a comparatively thick layer of silicon oxide 116 superimposed on it, in which openings are formed (which are represented by the dashed lines 113 and 114 in FIG. 7). In practice this can be realized by oxidizing the substrate 115 at the location where said oxide is needed. In these openings the transistors are formed and they are insulated from each other by the silicon oxide 116. In a further step p-type regions 117 are formed in the islands for the n-channel transistors, for example by means of ion-implantation. In a subsequent step thin layers of silicon oxide 118 are deposited on the p-type region 117 for the p-channel transistors and on the n-type substrate 115 for the n-channel transistors, which layers insulate the gate electrode to be formed from the semiconductor material disposed underneath it. In the present example the n-type polysilicon tracks 100 and 101 together with their branches 104 and 105, which are arranged on the gate insulation layers 118, and the polysilicon output tracks 112 are formed in the next step, and n-type layers 119a and 119b, which respectively constitute the source electrode and the drain electrode of the p-channel transistor $T_p$ to be formed, and p-type layers 120a and 120b, which respectively constitute the source electrodes and the drain electrodes of the n-channel transistors $T_n$ to be formed, are successively formed in the areas between the silicon oxide 116 and 118, for example by means of diffusion. In the same steps p-type contacts 122a, for the connection of the p-type region 117 to the source electrode metallization of the p-channel transistors $T_p$, and n-type contacts 122b, for connecting the n-type substrate to the source electrode metallization of the n-channel transistors $T_n$, are formed. In a subsequent step silicon oxide 123 is deposited for the definition of the contact apertures above the source and drain electrodes 119a, 119b, 120a and 120b and for the insulation of the polysilicon tracks so as to enable crossing with the metal tracks, the ends of the polysilicon tracks 112 being left free so as to enable contact to be made with the metal tracks 110 to be formed. Finally, the metal tracks 106, 107 and 110 including the branches 108 and 109 are formed, for example by vacuum deposition of aluminum.

The basic structure of the integrated circuit comprising the resistor network and the transistors $T_p$ and $T_n$ is highly compact. By constructing the two sub-networks as two nonparallel tracks, each transistor $T_p$ of a pair, which together constitute a threshold circuit (without voltage sources) in accordance with FIG. 3, will be situated adjacent the associated transistor $T_n$, so that very short noncrossing connections between their drain electrodes are possible. Moreover, the source electrodes of all transistors $T_p$ as well as those of all transistors $T_n$ may then be connected to the power supply terminals each via one track with branches.

With respect to the detailed structure as described with reference to FIGS. 7 to 11, it is to be noted that many variants are possible, which mainly depends on the process by means of which the integrated circuit is manufactured. Instead of silicon oxide a different insulating material may be used, for example silicon nitride. For the polysilicon resistance material it is also possible to select other materials, for example titanium. Instead of deposited resistance tracks it is also possible to form resistance tracks by means of a p- or n-type diffusion in the substrate.

With respect to the basic structure in accordance with FIG. 6, it is for example alternatively possible to arrange the power supply tracks 106 and 107 between the two rows of transistors and the resistance tracks 100 and 101 each on one side of the two rows of transistors.

What is claimed is:

1. A threshold circuit comprising a first field-effect transistor of a first conductivity type with a gate electrode, a source electrode and a drain electrode, a second field-effect transistor of a second complementary conductivity type with a gate electrode, a source electrode and a drain electrode, an input terminal connected to the gate electrodes of the first and second field-effect transistors, an output terminal connected to the drain electrodes of the first and second field-effect transistors, first and second power supply terminals connected respectively to the source electrodes of the first and second field-effect transistors, first means for applying a supply voltage between the first and second power supply terminals, and second means for applying a direct voltage between the gate electrodes of the first and second field-effect transistors, which voltage has the same polarity as the supply voltage to be applied and is substantially equal in value to said supply voltage less the sum of the threshold voltages of the first and second field-effect transistors.

2. A threshold circuit as claimed in claim 1, further comprising third means for applying a direct voltage between the input terminal and the gate electrode of the first field-effect transistor.

3. A threshold circuit as claimed in claim 2, wherein said third means is common with at least a part of said second means.

4. A threshold circuit as claimed in claim 2, wherein said third means comprises a first resistor, which is included between the input terminal and the gate electrode of the first field-effect transistor, the second meand comprising a second resistor which is included between the gate electrode of the first and second field-effect transistors, and means for passing a direct current through the series connection of the first and second resistors.

5. A threshold circuit as claimed in claim 3, wherein said second and third means comprise a first resistor between the input terminal and the gate electrode of the first field-effect transistor, and a second resistor between the input terminal and the gate electrode of the second transistor, and means for passing a direct current through the series connection of the first and second resistors.

6. A threshold circuit as claimed in claim 4 or 5, wherein said means for passing a direct current comprises means for applying said direct voltage across the series connection of the first and second resistors.

7. A threshold circuit as claimed in claim 4 or 5, characterized in that the threshold circuit comprises a first series connection of n resistors between a first and a second point, a second series connection of n resistors between the second point and a third point, that each $i^{th}$ resistor of the first series connection, reckoned from the first point, is included between the gate electrodes of an $i^{th}$ and an $(i+1)^{th}$ field-effect transistor of the first conductivity type, and each $i^{th}$ resistor of the second series connection, reckoned from the second point, is included between the gate electrodes of an $i^{th}$ and an $(i+1)^{th}$ field-effect transistor of the second conductivity type, i being a positive integer varying from 1 to n, that each drain electrode of the $i^{th}$ field-effect transistor of the first conductivity type together with the drain electrode of the $i^{th}$ field-effect transistor of the second conductivity type is connected to an $i^{th}$ output terminal, that the source electrodes of the n+1 field-effect transistors of the first conductivity type are jointly connected to the first power supply terminal, that the source electrodes of the n+1 field-effect transistors of the second conductivity type are jointly connected to the second power supply terminal, and that there are provided means for causing direct currents to flow through the first and the second series connection.

8. A threshold circuit as claimed in claim 7, wherein said means for causing direct current to flow comprises a direct voltage source between the first and the third point.

9. A threshold circuit as claimed in claim 8, further comprising an input resistor is between the first point and the point of constant voltage, for receiving a signal input current.

10. A threshold circuit as claimed in claim 9, wherein the threshold circuit comprises a bias current source for causing a bias current to flow through the input resistor.

11. An integrated circuit, comprising first and second resistance tracks, which tracks extend in substantially parallel directions, a series of n first field-effect transistors of a first conductivity type which are situated on a row which is substantially parallel to the first resistance track, a series of n second field-effect transistors of a second complementary conductivity type, which are situated on a row which is substantially parallel to the second resistance track, each first field-effect transistor being situated opposite a second field-effect transistor, a first conductor track which is situated substantially parallel to the row of first field-effect transistors and a second conductor track which is situated substantially parallel to the row of second field-effect transistors, the gate electrodes of the first field-effect transistors each being connected to the first resistance track, the gate electrodes of the second field-effect transistors each being connected to the second resistor track, the source electrodes of the first field-effect transistors each being connected to the first conductor track, the source electrodes of the second field-effect transistors each being connected to the second conductor track, and each drain electrode of a first field-effect transistor being connected to the drain electrode of the second field-effect transistor situated opposite said first field-effect transistor.

12. An integrated circuit as claimed in claim 11, characterized in that the first field effect transistors are situated with their channels parallel to the first resistance track between the first resistance track and the first conductor track, branches of said first resistance track and said first conductor track respectively leading to the gate electrodes and the source electrodes of the first field-effect transistors, and that the second field-effect transistors are situated with their channels parallel to the second resistance track between the second resistance track and the second conductor track, branches of said second resistance track and said second conductor track respectively leading to the gate electrode and the source electrodes of the second field-effect transistors.

13. An integrated circuit as claimed in claim 11 or 12, characterized in that the two resistance tracks are situated between the two rows of field-effect transistors and that the two conductor tracks are situated one on each side of the two rows of transistors.

14. An integrated circuit as claimed in claim 13, characterized in that the two resistance tracks are covered with an insulating layer, and that the drain electrodes of every two facing field-effect transistors are connected to a third conductor track which passes over said insulating layer.

15. An integrated circuit as claimed in claim 14, characterized in that said third conductor track adjoins third tracks of the same material as the first and the second resistance tracks, which third tracks are also covered with an insulating layer, and pass underneath said first conductor track in directions substantially perpendicular to the direction of the first conductor track.

16. An integrated circuit as claimed in claim 12 or 13, characterized in that a fourth conductor track is provided for the connection of one end of the first resistance track to the nonadjacent end of the second resistance track.

* * * * *

UNITED STATES PATENT AND TRADEMARK OFFICE
CERTIFICATE OF CORRECTION

PATENT NO. : 4,326,136

DATED : April 20, 1982

INVENTOR(S) : Claude J.P.F. Le Can, Maurice V. Whelan and Karel Hart

It is certified that error appears in the above—identified patent and that said Letters Patent is hereby corrected as shown below:

Claim 4, line 5, change "meand" to --means--

Signed and Sealed this

Twenth-eighth Day of September 1982

[SEAL]

Attest:

GERALD J. MOSSINGHOFF

Attesting Officer    Commissioner of Patents and Trademarks